United States Patent
Sadra et al.

(10) Patent No.: US 8,067,279 B2
(45) Date of Patent: Nov. 29, 2011

(54) APPLICATION OF DIFFERENT ISOLATION SCHEMES FOR LOGIC AND EMBEDDED MEMORY

(75) Inventors: Kayvan Sadra, Addison, TX (US); Alwin Tsao, Garland, TX (US); Seetharaman Sridhar, Richardson, TX (US); Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/489,223

(22) Filed: Jun. 22, 2009

(65) Prior Publication Data

US 2009/0258471 A1 Oct. 15, 2009

Related U.S. Application Data

(62) Division of application No. 11/848,187, filed on Aug. 30, 2007, now Pat. No. 7,662,688, which is a division of application No. 11/296,164, filed on Dec. 7, 2005, now Pat. No. 7,314,800, which is a division of application No. 10/694,237, filed on Oct. 27, 2003, now Pat. No. 7,141,468.

(51) Int. Cl.
*H01L 21/00* (2006.01)

(52) U.S. Cl. .......................... 438/200; 438/275; 438/423

(58) Field of Classification Search .................. 438/200, 438/275, 423
See application file for complete search history.

(56) References Cited

U.S. PATENT DOCUMENTS

| | | | |
|---|---|---|---|
| 5,156,990 A | | 10/1992 | Mitchell |
| 5,702,988 A | * | 12/1997 | Liang .............................. 438/238 |
| 5,728,621 A | | 3/1998 | Zheng et al. |
| 5,817,567 A | | 10/1998 | Jang et al. |
| 5,858,826 A | * | 1/1999 | Lee et al. ........................ 438/228 |
| 5,872,043 A | | 2/1999 | Chen |
| 5,880,007 A | | 3/1999 | Varian et al. |
| 5,923,993 A | | 7/1999 | Sahota |
| 5,960,276 A | | 9/1999 | Liaw et al. |
| 6,020,226 A | * | 2/2000 | Cerny et al. .................... 438/167 |
| 6,190,979 B1 | | 2/2001 | Radens et al. |
| 6,198,116 B1 | * | 3/2001 | Cerny et al. .................... 257/194 |
| 6,265,292 B1 | | 7/2001 | Parat et al. |
| 6,399,461 B1 | | 6/2002 | Liu et al. |
| 6,486,517 B2 | | 11/2002 | Park |
| 6,521,493 B1 | | 2/2003 | Alsmeier et al. |
| 6,534,781 B2 | | 3/2003 | Dennison |
| 6,593,176 B2 | | 7/2003 | Dennison |
| 6,599,804 B2 | | 7/2003 | Bulucea et al. |
| 6,600,186 B1 | * | 7/2003 | Lee et al. ........................ 257/296 |
| 6,624,022 B1 | | 9/2003 | Hurley et al. |
| 6,627,937 B2 | | 9/2003 | Shinkawata |
| 6,649,968 B2 | | 11/2003 | Wolstenholme |
| 6,656,783 B2 | | 12/2003 | Park |

(Continued)

*Primary Examiner* — Laura Menz
(74) *Attorney, Agent, or Firm* — Rose Alyssa Keagy; Wade J. Brady, III; Frederick J. Telecky, Jr.

(57) ABSTRACT

The present invention facilitates semiconductor device fabrication by providing mechanisms for utilizing different isolation schemes within embedded memory and other logic portions of a device. The isolation mechanism of the embedded memory portion is improved relative to other portions of the device by increasing dopant concentrations or reducing the depth of the dopant profiles within well regions of the embedded memory array. As a result, smaller isolation spacing can be employed thereby permitting a more compact array. The isolation mechanism of the logic portion is relatively less than that of the embedded memory portion, which permits greater operational speed for the logic.

5 Claims, 14 Drawing Sheets

U.S. PATENT DOCUMENTS

| | | | |
|---|---|---|---|
| 6,674,145 B2 | 1/2004 | Hurley et al. | |
| 6,690,051 B2 | 2/2004 | Hurley et al. | |
| 6,707,079 B2 | 3/2004 | Satoh et al. | |
| 6,713,346 B2 | 3/2004 | Wolstenholme | |
| 6,753,231 B2 * | 6/2004 | Ikeda et al. | 438/289 |
| 6,777,286 B2 * | 8/2004 | Clevenger et al. | 438/238 |
| 6,914,287 B2 | 7/2005 | Tran | |
| 6,949,445 B2 | 9/2005 | Rhodes et al. | |
| 7,029,997 B2 | 4/2006 | Wu | |
| 7,045,410 B2 | 5/2006 | Mehrad et al. | |
| 7,057,257 B2 | 6/2006 | Tran | |
| 7,141,468 B2 * | 11/2006 | Sadra et al. | 438/200 |
| 7,193,277 B2 * | 3/2007 | Sadra et al. | 257/374 |
| 7,208,390 B2 | 4/2007 | Singh et al. | |
| 7,314,800 B2 * | 1/2008 | Sadra et al. | 438/275 |
| 7,514,757 B2 * | 4/2009 | Liaw | 257/393 |
| 7,662,688 B2 * | 2/2010 | Sadra et al. | 438/275 |
| 2002/0155657 A1 * | 10/2002 | Ikeda et al. | 438/238 |
| 2002/0180068 A1 * | 12/2002 | Clevenger et al. | 257/903 |
| 2004/0152279 A1 * | 8/2004 | Madurawe | 438/400 |
| 2005/0037594 A1 | 2/2005 | Wu | |
| 2005/0087810 A1 * | 4/2005 | Sadra et al. | 257/368 |
| 2005/0124102 A1 | 6/2005 | Wang et al. | |
| 2005/0145949 A1 * | 7/2005 | Sadra et al. | 257/368 |
| 2005/0266628 A1 | 12/2005 | Wang et al. | |
| 2006/0038240 A1 * | 2/2006 | Tsutsumi et al. | 257/392 |
| 2006/0084230 A1 * | 4/2006 | Sadra et al. | 438/275 |
| 2007/0141794 A1 | 6/2007 | Morris | |
| 2007/0290192 A1 * | 12/2007 | Rotondaro | 257/19 |
| 2008/0003772 A1 * | 1/2008 | Sadra et al. | 438/423 |
| 2008/0121942 A1 * | 5/2008 | Liaw | 257/211 |
| 2008/0128756 A1 * | 6/2008 | Satoh | 257/203 |
| 2009/0258471 A1 * | 10/2009 | Sadra et al. | 438/423 |

* cited by examiner

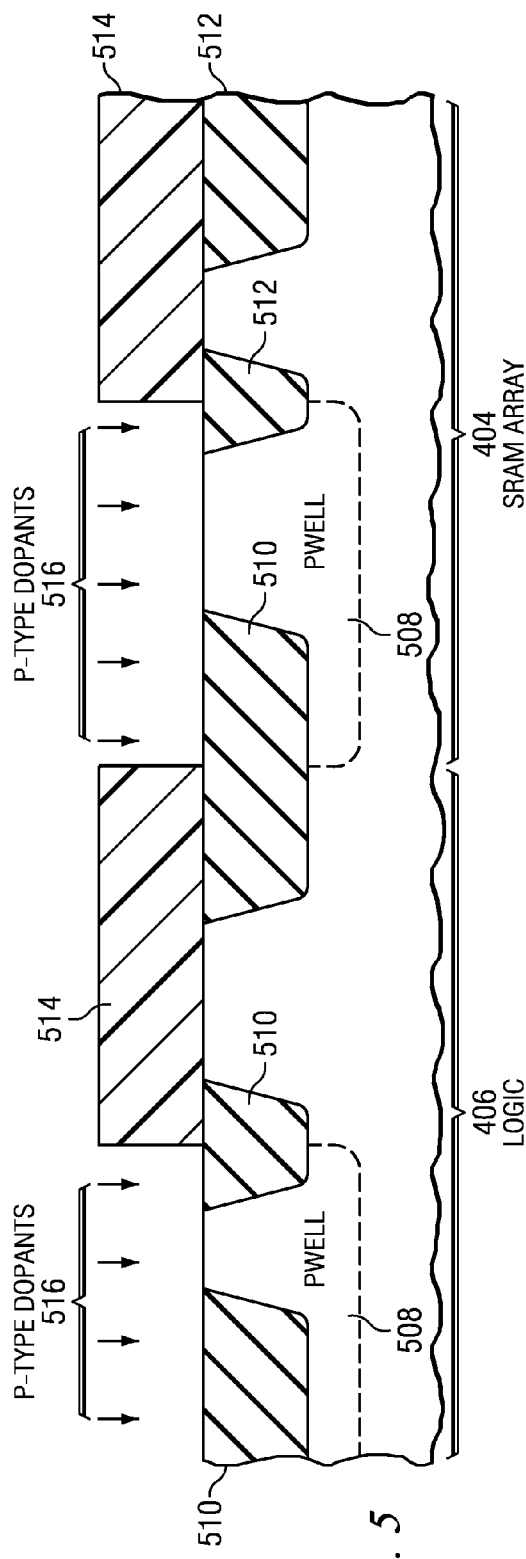
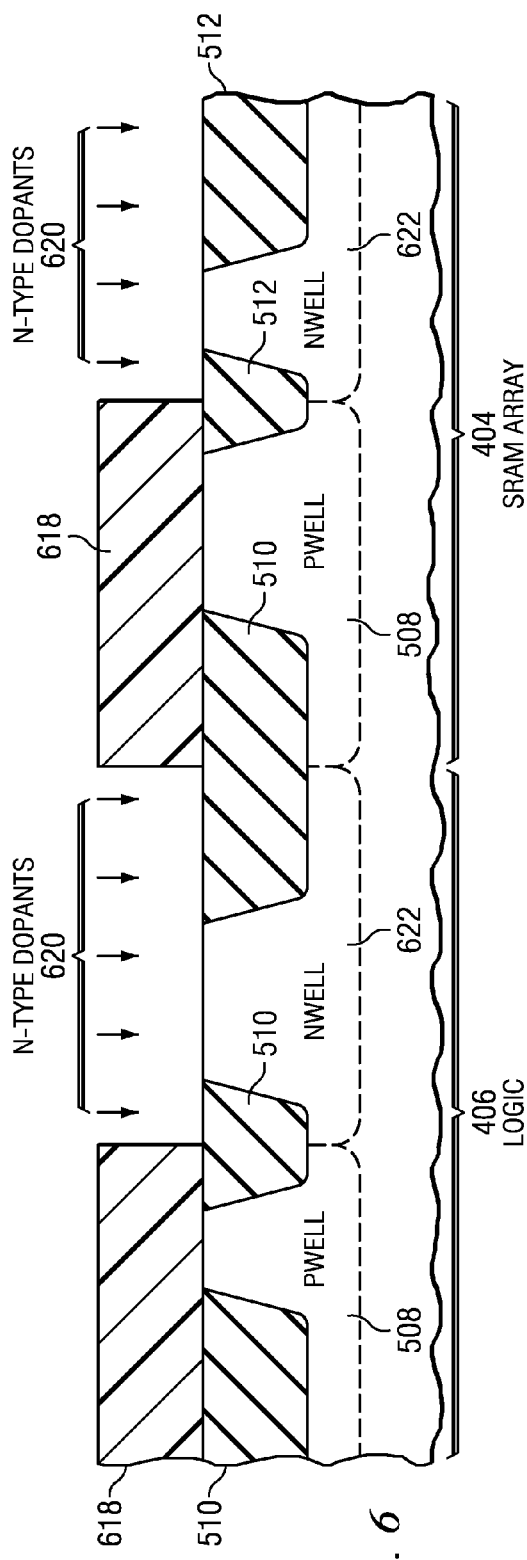
FIG. 5
FIG. 6

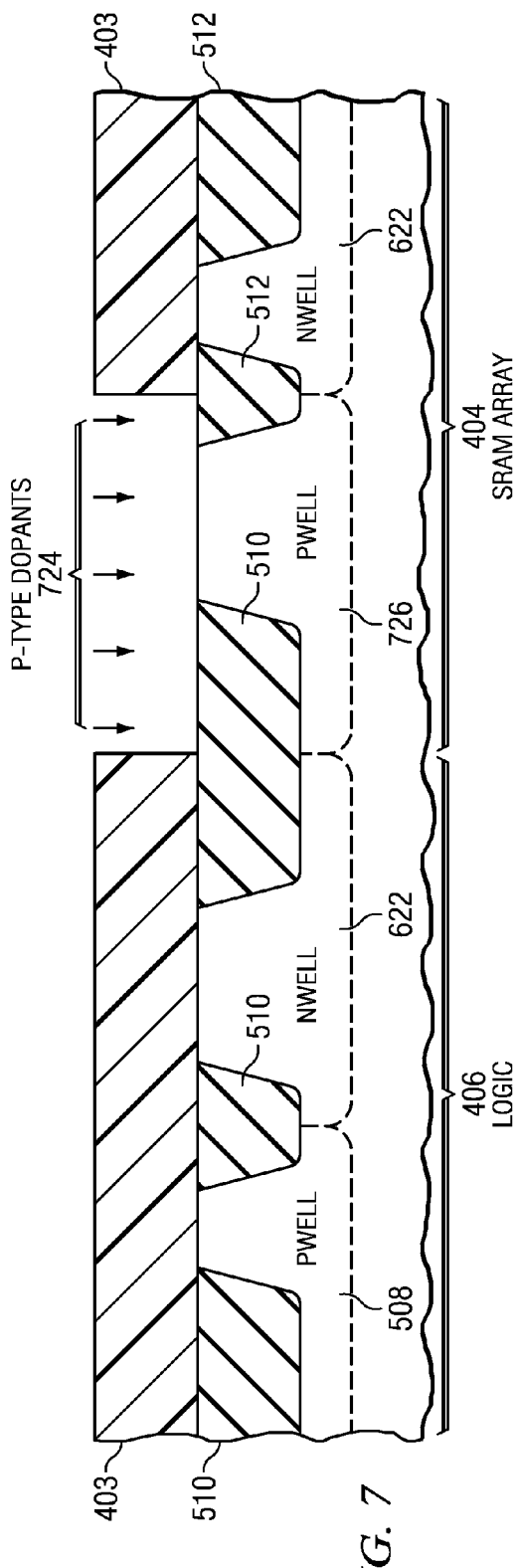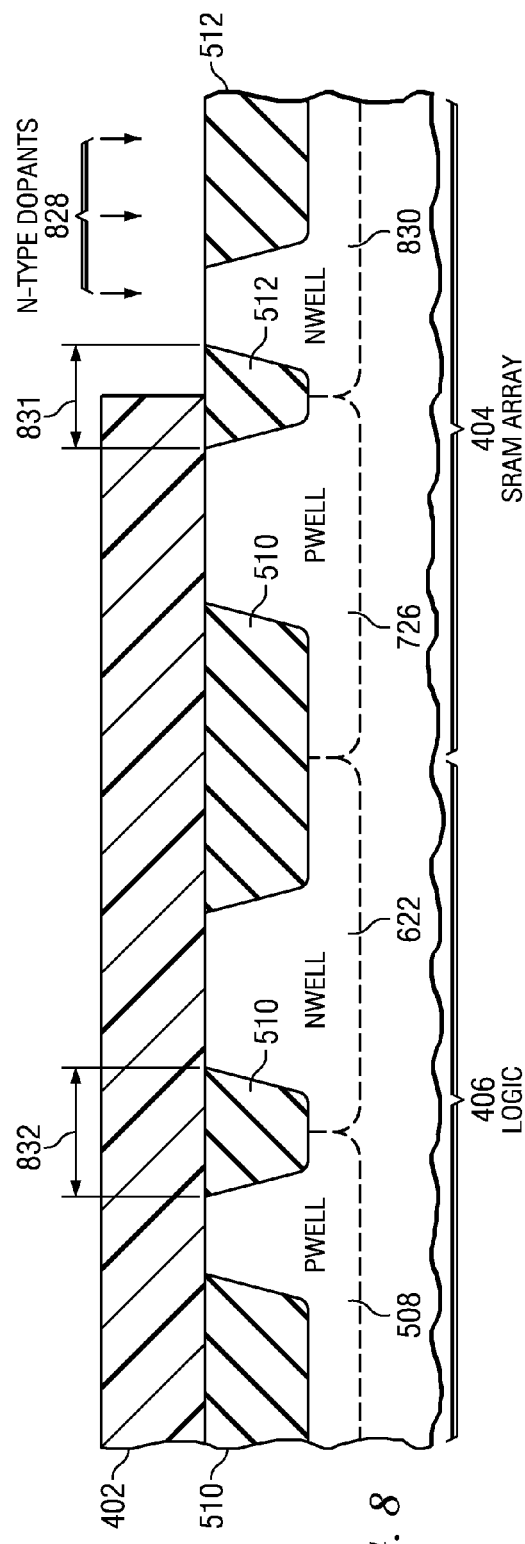

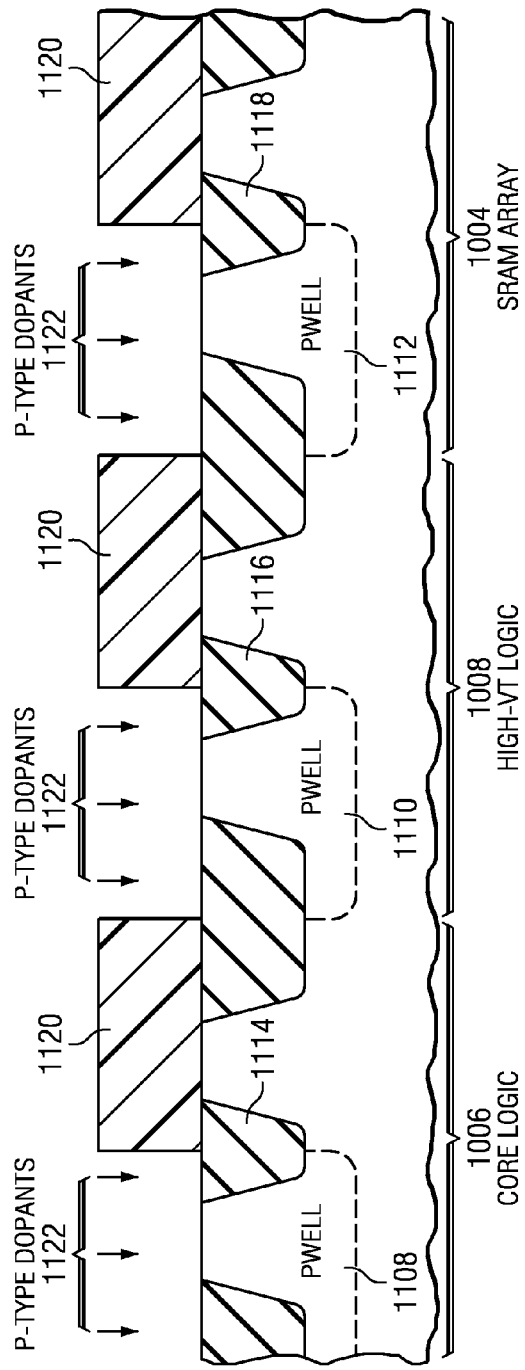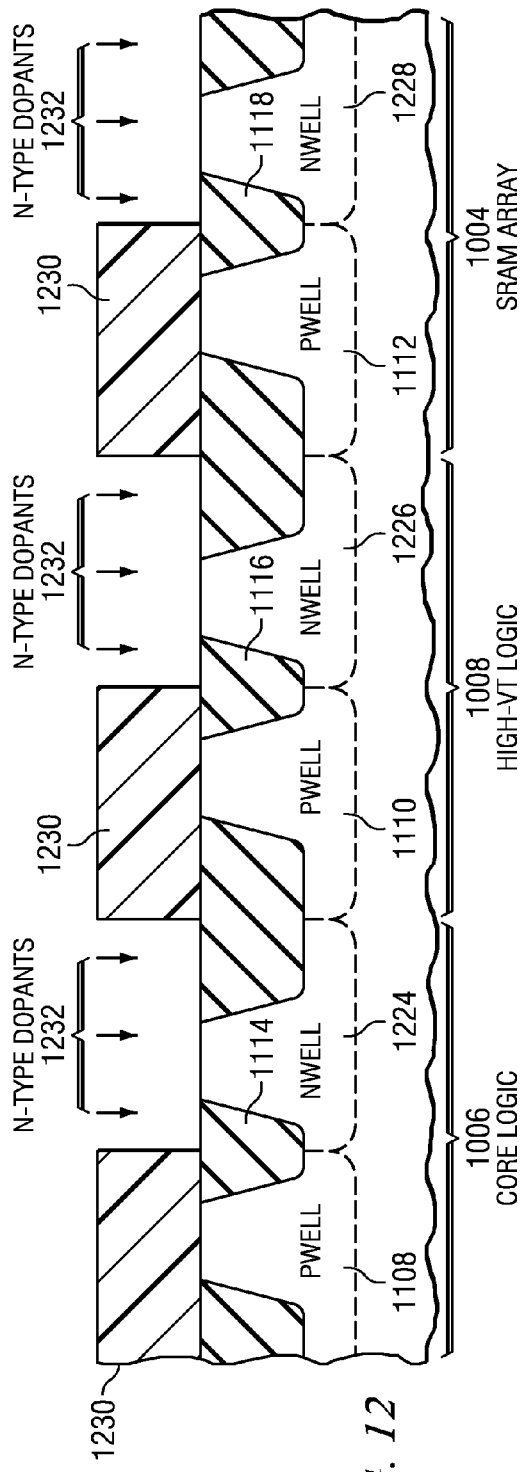

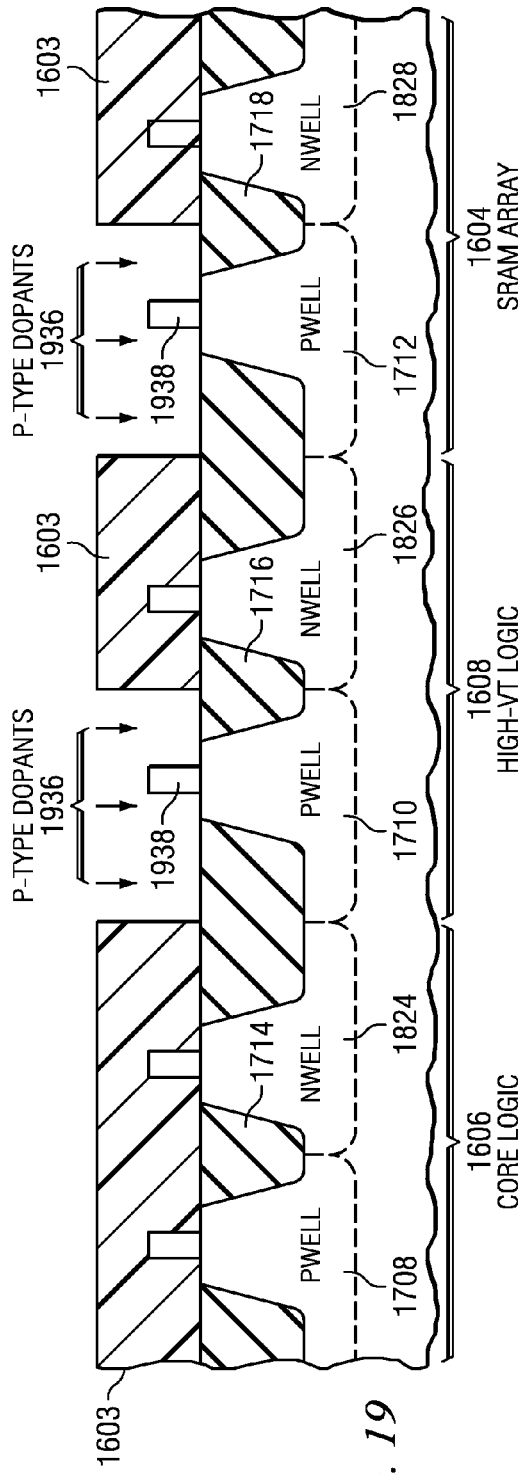
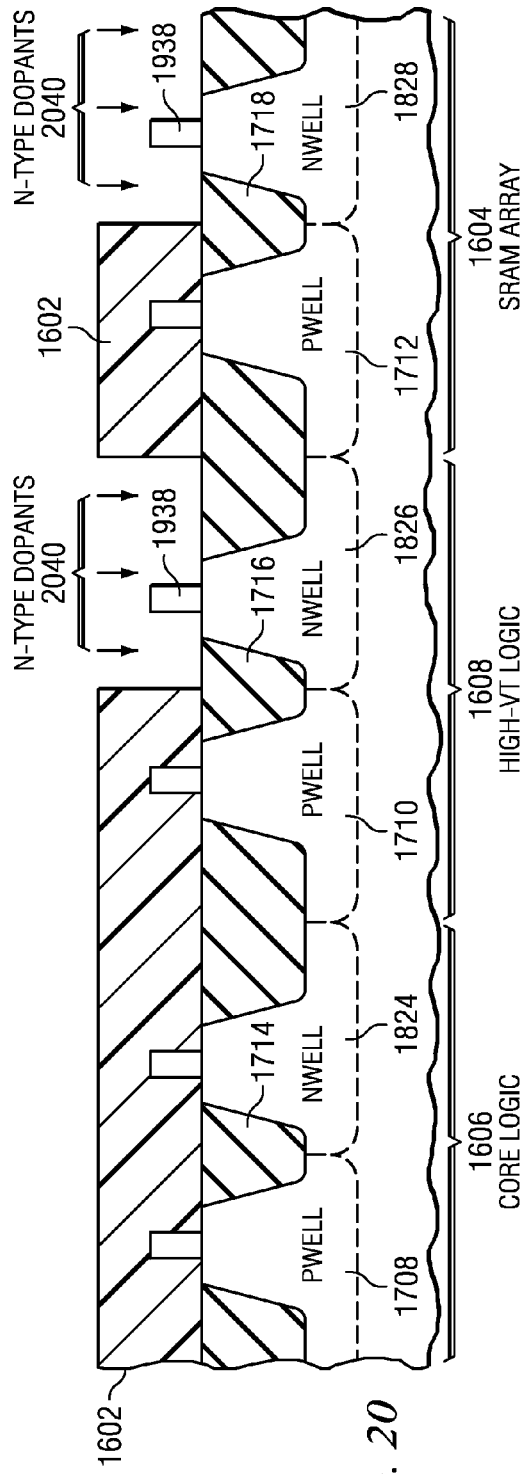
FIG. 19
FIG. 20

APPLICATION OF DIFFERENT ISOLATION SCHEMES FOR LOGIC AND EMBEDDED MEMORY

CROSS-REFERENCE TO RELATED APPLICATIONS

This is a division of application Ser. No. 11/848,187, filed Aug. 30, 2007, which is a division of application Ser. No. 11/296,164, filed Dec. 7, 2005, which is a division of application Ser. No. 10/694,237, filed Oct. 27, 2003, the entire disclosure of which is hereby incorporated by reference.

FIELD OF THE INVENTION

The present invention relates generally to the field of semiconductor devices, and more particularly, to different isolation schemes for logic and embedded memory in semiconductor devices.

BACKGROUND OF THE INVENTION

Electronic devices typically include a number of individual components such as memory, logic, and the like. In the past, these individual components have been formed on separate die or chips. These separate chips were packaged separately and attached to one or more circuit boards of the electronic device. The circuit board contained the necessary interconnects to attain desired functionality from the individual components. As a result, the electronic device as a whole operated according to the individual components formed and interconnected via one or more circuit boards and electronic connections.

One problem with utilizing individual components packaged separately is that great/substantial reductions in die or component sizes do not always yield the same reduction in component size due to the fact that packaging and interconnects do not generally reduce in proportion. Thus, desired scaling/shrinking, which is a continuing demand for electronic devices, may not be obtained despite reduction in die sizes.

One potential solution is to combine multiple components onto a single die. Thus, for example, logic can be combined with embedded memory on a single die. The necessary interconnects between the logic and the embedded memory are formed within/on the die thereby reducing the need for interconnects on a circuit board, separate packaging, heatsinks, and the like. Additionally, performance gains can be achieved by reducing transmission path lengths and the like between components.

However, some desired space savings can be lost by combining multiple components onto a single die. Fabrication procedures employed for multiple components may not be as well suited as procedures employed for single, specific components. As a result, in some instances at least a portion of one or more components may be fabricated to a relatively larger size than would otherwise be done.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by providing mechanisms for utilizing different isolation schemes within embedded memory and other logic portions of a device. The isolation performance of the embedded memory portion is improved relative to other portions of the device by increasing dopant concentration within well regions therein. As a result, smaller (n+-p+) isolation spacing can be employed thereby permitting a more compact design. The isolation in the logic portion uses lower doping/concentration than that of the embedded memory portion, which permits lower capacitance and therefore greater operational speed within the logic. Thus, reduced spacing is achieved within the memory portion without negatively impacting device performance within the logic portions of the die.

A number of suitable methods are employed to achieve the different isolation schemes. One method utilizes additional pattern levels to perform a supplemental isolation implant within the embedded memory portion. Another uses pattern levels that are already utilized in the process flow to fabricate high-threshold-voltage transistors to also perform supplemental isolation implants within the embedded memory portion. Yet another employs additional pattern levels to allow for distinct isolation implants in the logic and memory portions, with the implants in the memory portion being relatively shallower than those in the logic.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 5 is a cross sectional diagram illustrating a stage of fabrication of a semiconductor device in accordance with an aspect of the present invention.

FIG. 6 is a cross sectional diagram illustrating a stage of fabrication of a semiconductor device in accordance with an aspect of the present invention.

FIG. 7 is a cross sectional diagram illustrating a stage of fabrication of a semiconductor device in accordance with an aspect of the present invention.

FIG. 8 is a cross sectional diagram illustrating a stage of fabrication of a semiconductor device in accordance with an aspect of the present invention.

FIG. 11 is a cross sectional diagram illustrating a stage of fabrication of a semiconductor device in accordance with an aspect of the present invention.

FIG. 12 is a cross sectional diagram illustrating a stage of fabrication of a semiconductor device in accordance with an aspect of the present invention.

FIG. 19 is a cross sectional diagram illustrating a stage of fabrication of a semiconductor device in accordance with an aspect of the present invention.

FIG. 20 is a cross sectional diagram illustrating a stage of fabrication of a semiconductor device in accordance with an aspect of the present invention.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention provides systems and methods that can reduce dimensions and area consumption of semiconductor devices by facilitating tighter spacing for an embedded memory portion of a semiconductor device. In conventional devices that include embedded memory, the same isolation doping profiles are employed for the embedded memory and logic portions of the device, limiting the extent to which memory n+-p+ isolation spacings (across well boundaries) can be reduced. However, the inventors of the present invention appreciate that often, embedded memory does not require the same speed of operation as logic and/or the requirement for small memory size is more important than memory speed. As a result, the embedded memory portion can therefore employ different doping profiles to achieve relatively tighter isolation spacing. Accordingly, the present invention employs different isolation doping profiles for the embedded memory portion that facilitates device shrinkage. The term isolation doping profile refers to those portions of the doping profile that affect the isolation performance and comprises varied concentrations throughout a depth of a well. Likewise, the term isolation implants refers to those implants that contribute to these portions of the doping profile. In most cases, the isolation doping profile would be the deeper portions of the profile below the source and drain and the implants contributing to these portions would be principally the channel-stop and well implants.

Figure 1:
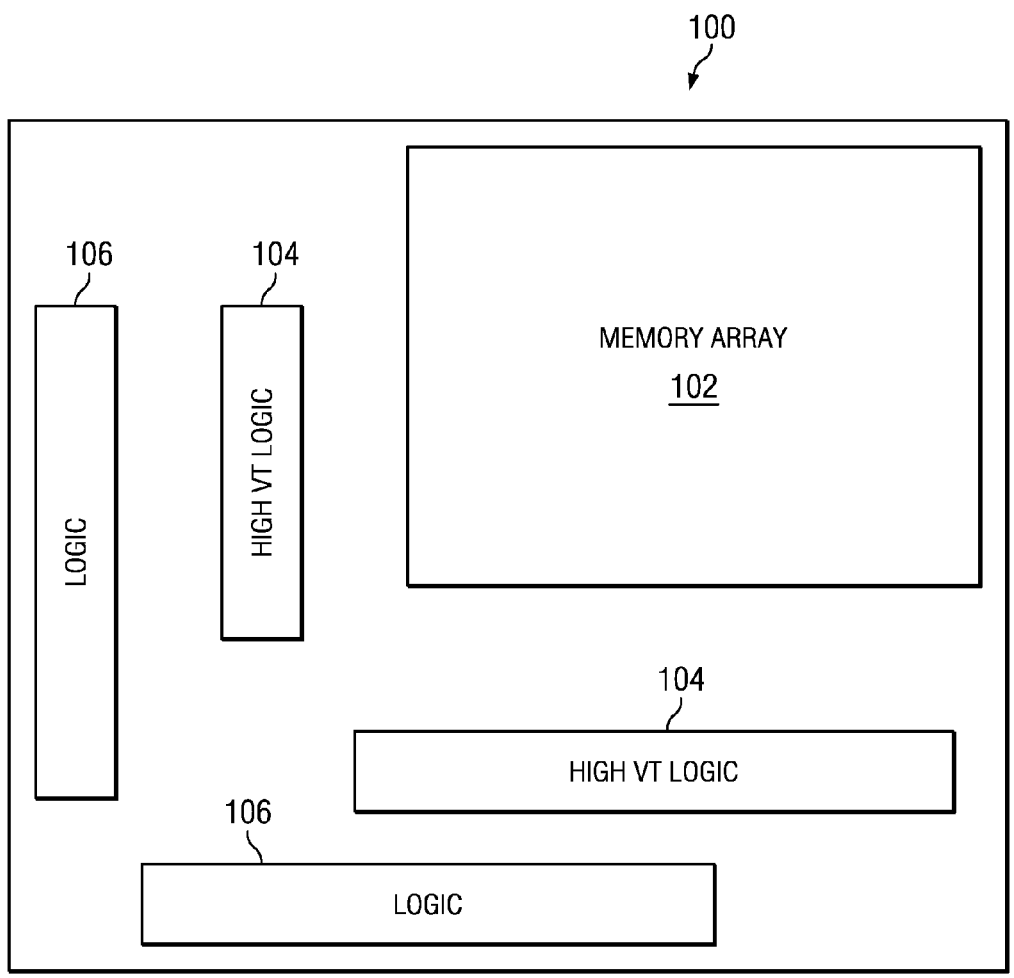
FIG. 1 is a block diagram of a semiconductor device comprising embedded memory in accordance with an aspect of the present invention.

Beginning with FIG. 1, a block diagram of a semiconductor device 100 comprising embedded memory in accordance with an aspect of the present invention is depicted. The device 100 presented and discussed is merely exemplary of devices that can be fabricated in accordance with the present invention. The device 100 is formed within and/or on a semiconductor substrate.

The device 100 includes an embedded memory array 102, high threshold voltage logic 104, and logic 106 and is formed in/on a semiconductor material or wafer. It is appreciated that the present invention includes variations in which the device 100 does not include high threshold voltage logic 104. Although not shown, the device 100 can include other components, including other embedded memory arrays, which may differ from the memory array 102 in memory type or in speed and size requirements. For example, these other memory arrays may be intended for high-speed operation and their size may be relatively less important. Unlike similar conventional devices, the embedded memory array 102 and the logic 106 are formed with different isolation mechanisms in order to increase density and decrease the overall size of the semiconductor device 100. Generally, the memory array 102 employs an isolation mechanism comprising relatively narrower isolation regions between active regions across well regions of differing type, and higher dopant concentrations within the well regions, than the isolation mechanism employed by the logic 106. The isolation mechanism of the memory array 102 permits a greater density for transistors within the memory array than would otherwise be achieved by employing the isolation mechanism employed for the logic 106.

Smaller n+-p+ isolation spacing requires more aggressive (e.g., relatively higher dopant concentration and/or shallower) isolation doping profiles. These profiles typically produce relatively higher junction capacitance, which reduces operating speed. As a result, there is a trade-off between how small the isolation spacing is and how fast a circuit using that isolation spacing may operate.

The logic 106 and the memory array 102 have differing junction capacitance requirements. Generally, the logic 106 is required to operate at relatively high speeds, which necessitate relatively low junction capacitance. The memory array 102, on the other hand, may be able to tolerate higher junction capacitance. This may be, for example, because the memory array 102 is not required to operate at relatively high speeds, or because the requirement for small memory cell size is more important than that for speed. Thus, isolation schemes using shallower or higher-concentration doping profiles, such as employed for the memory array 102, increase the junction capacitance in the memory array. However, because the acceptable junction capacitance for the memory array 102 may be higher than that required for the logic 106, the memory array 102 can tolerate such aggressive doping profiles and still perform acceptably. The high threshold-voltage logic 104, in those aspects of the invention where it is present, typically has lower speed requirements than the logic 106, and can therefore tolerate high junction capacitance similar to that of the memory array 102.

Conventionally, the same isolation implants where used for logic and embedded memory arrays. This resulted in either a relatively larger memory cell size to keep the logic capacitance low, or a relatively larger logic junction capacitance to support a relatively smaller memory cell, or both.

Unlike conventional devices, the logic 106 and the memory array 102 utilize different isolation implants as stated above. The logic 106 employs less aggressive dopant profiles to achieve low junction capacitance and high speed at the expense of relatively large n+-p+ isolation spacing, whereas the memory array 102 employs more aggressive dopant profiles in order to reduce the isolation spacing and reduce/conserve area. Some exemplary dopant profiles are shown in FIGS. 27-32 and described infra.

The distinct isolation mechanisms employed for the logic 106 and the memory array 102 can be formed or fabricated in a number of suitable ways. Shallow trench isolation (STI) regions of different widths can be formed by etching trenches to the differing widths and filling/depositing with a dielectric such as oxide according to one or more suitable fabrication procedures. The different resulting dopant concentrations can be achieved by implanting dopants for the logic 106 and the memory array 102 in separate procedures/processes and/or by performing a first implant for the logic 106 and the memory array 102 followed by a supplemental isolation/well implant for only the memory array 102. In those aspects of the invention where the high-threshold voltage logic 104 is present, n-well and/or p-well areas associated with the high voltage threshold logic 104 and the memory array 102 are exposed for stand-alone and/or supplemental implants. The n-well region, p-well region, or both can receive stand-alone and/or supplemental implants depending on the trade-off between junction capacitance and isolation spacing for each polarity. Finally, the memory well regions to be exposed for stand-alone and/or supplemental isolation/well implants may be exposed using additional resist pattern levels or resist pattern levels already present in the process flow. Additional resist pattern levels are pattern levels that would not exist in the process flow if isolation/well implants were the same in all regions of the chip. Resist pattern levels already present in the process flow are any pattern levels that would exist in the process flow even if isolation/well implants were the same in all regions of the chip.

Figure 2:
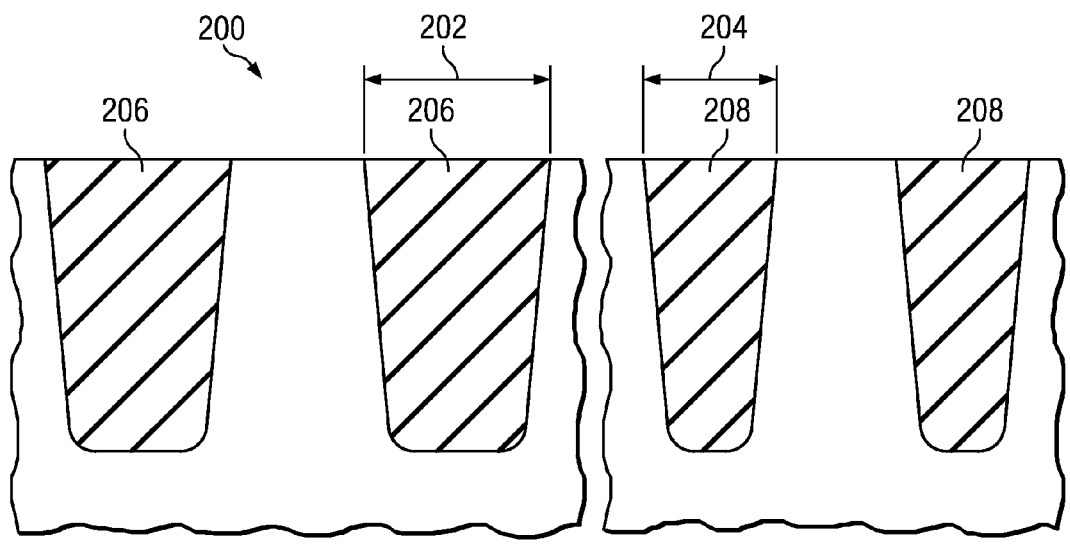
FIG. 2 is a diagram illustrating exemplary n+-p+ isolation spacing for a semiconductor device in accordance with an aspect of the present invention.

FIG. 2 illustrates exemplary n+-p+ isolation spacing for a device in accordance with an aspect of the present invention. This FIG. 2 is provided for illustrative purposes and is not intended to limit the present invention to particular sizes, dimensions, configurations, and the like. Generally, elements (e.g., transistors and the like) formed within/on a semiconductor device are at least partially isolated from each other by isolation regions. These regions prevent or mitigate effects of one element or component from affecting another. FIG. 2 shows a common type of isolation region referred to as a shallow trench isolation (STI) region. For a logic portion of the device, STI regions are illustrated with a logic n+-p+ isolation spacing 202. Similarly, for a memory array portion, STI regions 208 are depicted with a memory n+-p+ isolation spacing 204. From FIG. 2, it can be seen that the logic isolation spacing 202 is relatively larger than the memory isolation spacing 204. Actual values of n+-p+ isolation spacings depend on many factors, such as the year and technology node. However, exemplary values at some given time may be 300 nm for the logic and 200 nm for the memory array.

Returning now to FIG. 1, the different isolation spacing for the logic 106 and the memory array 102 can be achieved by any number of suitable techniques. A first technique is to employ additional pattern levels or masks in order to form the isolation regions distinctly. Conventionally, the isolation regions were formed via a single set of pattern levels that forms substantially similar spaced isolation regions within logic and memory regions. Employing additional pattern levels facilitates forming different isolation regions but can increase cost of production/fabrication as a result of the added pattern levels. A second technique is to employ existing pattern levels already used in that technology for other purposes (e.g., for high threshold voltage patterns). The advantage of this technique is that additional pattern levels and processing steps can, at least partly, be avoided.

Figure 3:
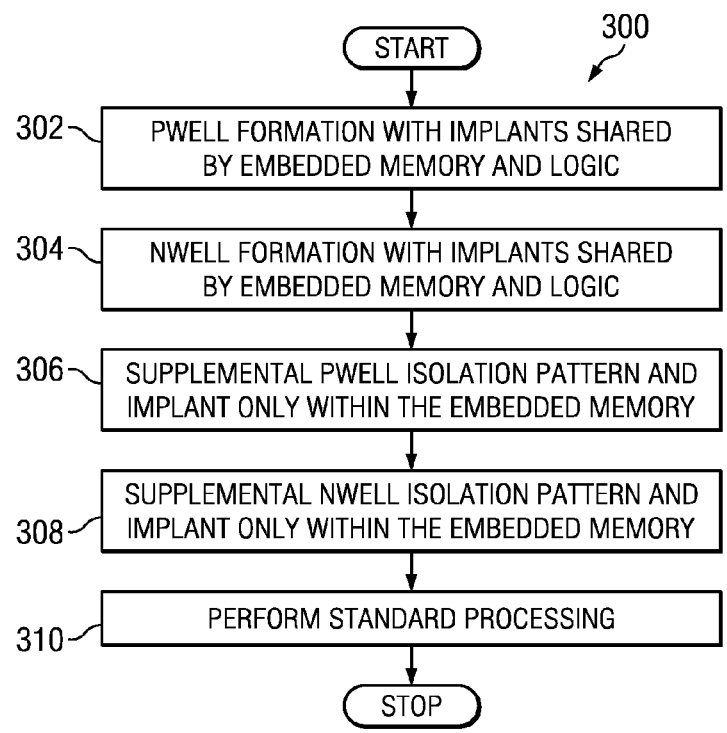
FIG. 3 is a flow diagram illustrating a method of fabricating a semiconductor device with a higher channel stop in accordance with an aspect of the present invention.

FIG. 3 is a flow diagram illustrating a method 300 of fabricating a semiconductor device with a higher channel-stop or well dose (distinct isolation mechanism) for a memory array portion of the device than a logic portion of the device by employing additional pattern levels in accordance with an aspect of the present invention. The semiconductor device includes an embedded memory portion and a logic portion. The method 300 is provided as an exemplary method in which to utilize different isolation schemes for the embedded memory and the logic portions on the device in accordance with the present invention. The method 300 is further described with respect to FIGS. 4-9 so as to further illustrate the method 300. However, it is appreciated that variations in structure from FIGS. 4-9 are permitted in accordance with the present invention.

Figure 4:
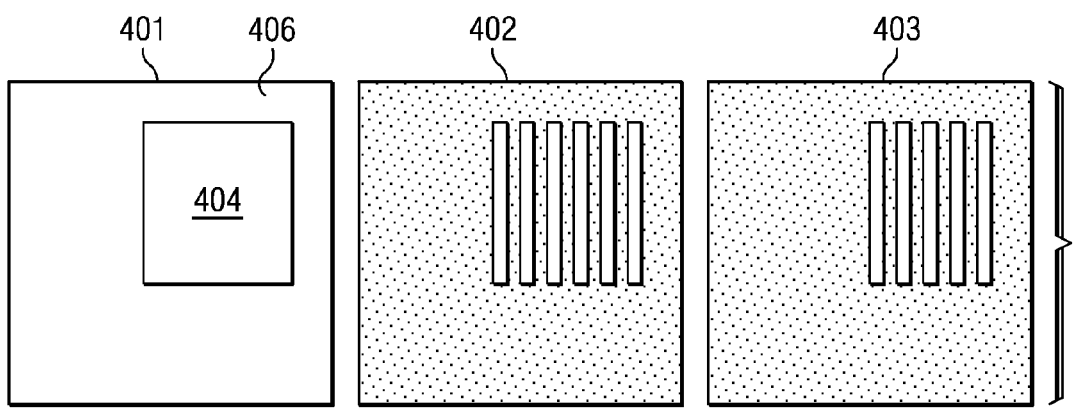
FIG. 4 is a plan view of a semiconductor device and associated resist patterns in accordance with an aspect of the present invention.

FIG. 4 is a plan view of the device and additional resist patterns of FIG. 3 in accordance with an aspect of the present invention. A top view 401 of the device illustrates the embedded memory portion 404 and the logic portion 406 (other areas of the device). A supplemental n-well resist layer 402 and a supplemental p-well resist layer 403 are also shown. These layers are employed and described further below.

The method 300 begins at block 302 where a p-well implant is performed for both the logic and embedded memory portions by selectively implanting one or more p-type dopants (e.g., boron) at selected doses, angles, and energies. As a result, p-well regions are selectively formed within a semiconductor substrate with a selected/desired concentration and depth profile. FIG. 5 is a cross sectional diagram that depicts the device at this stage of fabrication in accordance with an aspect of the present invention. Shallow trench isolation (STI) layers 510 within the logic portion 406 and STI layers 512 within the embedded memory portion 404 are already present prior to the p-well regions formation in the present example. A first patterned resist layer 514 is employed to define p-well regions in the substrate, and one or more p-type implants 516 are performed to form p-well regions 508 throughout the device in both the logic portion 406 and the embedded memory portion 404. These implants may include a relatively deep well implant, a shallower channel-stop implant, a still shallower punch-through implant, and a still shallower channel implant. Subsequent to the implant(s), the first resist layer 514 is removed from the device.

Continuing at block 304, n-well areas are formed for both the logic and embedded memory regions by selectively implanting one or more n-type dopants (e.g., phosphorous or arsenic) at selected doses, angles, and energies. FIG. 6 serves to illustrate the device at this stage of fabrication in accordance with an aspect of the present invention. A second resist layer 618 is employed to selectively implant one or more n-type dopants 620 into the device forming n-well regions 622 in both the logic portion 406 and the embedded memory portion 404. These implants may include a relatively deep well implant, a shallower channel-stop implant, a still shallower punch-through implant, and a still shallower channel implant. The second resist layer 618 prevents or mitigates the n-type dopant 620 from entering the p-well regions 508. Also, the second resist layer 618 is removed from the device subsequent to the implant of block 304 of FIG. 3.

At block 306, one or more supplemental implants are performed for the embedded memory regions by selectively implanting one or more p-type dopants into p-well regions within the memory portion. FIG. 7 is a cross sectional diagram that illustrates the device at this stage of fabrication in accordance with an aspect of the present invention. Here, one or more p-type dopants 724 are selectively implanted into p-well regions 726 of the embedded memory portion 404 of the substrate. The p-well resist layer 403 is employed to define the one or more regions 726 for the implant. The implants may include a relatively deep supplemental well implant or a shallower supplemental channel-stop implant. The supplemental implants are performed with a dose and energy so as to achieve a desired dopant concentration profile in the p-well regions 726. Exemplary concentrations with and without the supplemental implants are shown in FIGS. 27-32 and described infra. The resist layer 403 is removed after performing the implant.

One or more supplemental n-type dopants are implanted in the embedded memory regions at block 308 of FIG. 3. FIG. 8 is a cross sectional diagram that depicts the device at this stage of fabrication in accordance with an aspect of the present invention. Here, one or more n-type dopants 828 are selectively implanted into n-well regions 830 of the embedded memory portion 404. The resist layer 402 is employed to define the region 830 for the implant. Additionally, the implant(s) are performed with a dose and energy so as to achieve a desired dopant concentration profile in the n-well regions 830. Exemplary concentrations with and without the supplemental implants are shown in FIGS. 27-32 and described infra. The resist layer 402 is removed after performing the implant. It is appreciated that the present invention includes variations of this method 300 wherein only one of the supplemental p-well and supplemental n-well implants is performed and does not require the blocks being performed in a specific order. Furthermore, the four blocks described supra 302, 304, 306, and 308 can be performed in any suitable order.

Continuing at block 310, standard processing is performed on the device. The standard processing includes forming gate structures, spacers, contacts, metal interconnects and vias, packaging, and the like in order to complete fabrication of the device.

Still referring to FIG. 8, note that a spacing 831 between active regions in the well regions 726, 830 in the memory area 404 (as dictated by the STI 512) is substantially smaller than a spacing 832 in the logic portion 406 of the device. The substantially reduced spacing 831 is enabled because the well regions 726, 830 are more heavily doped due to the supplemental implants (blocks 306 and 308 of FIG. 3) therein. Accordingly, devices needing isolation from one another within the memory array portion 404 can be spaced closer together, thereby improving packing density therein.

Figure 9:
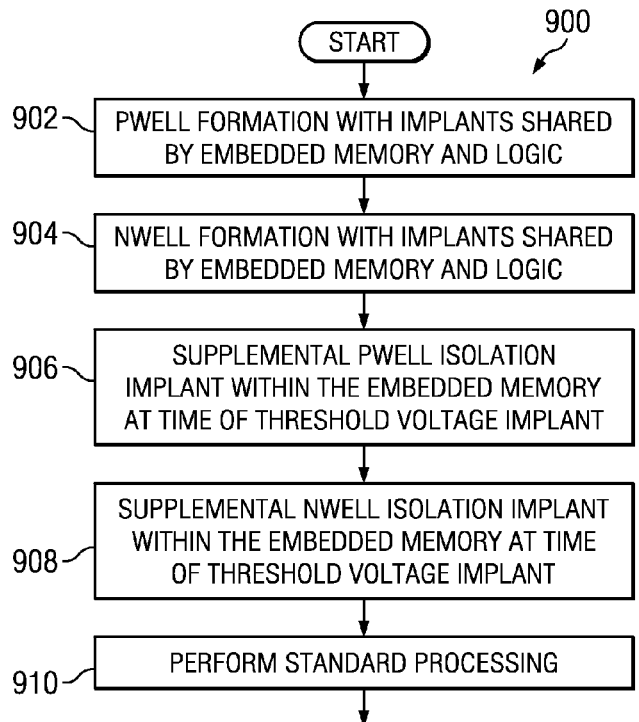
FIG. 9 is a flow diagram illustrating a method of fabricating a semiconductor device with a higher channel stop utilizing existing pattern levels originally employed for threshold-adjust channel implants in accordance with an aspect of the present invention.

FIG. 9 is a flow diagram illustrating a method 900 of fabricating a semiconductor device with a higher channel-stop or well dose (distinct isolation mechanism) for a memory array of the device than a logic portion by employing existing pattern levels used for threshold-adjust channel implants for high threshold-voltage transistors. The device includes an embedded memory portion, a core logic portion, and possibly a high-threshold-voltage logic portion. The embedded memory array utilizes high-threshold-voltage transistors. The embedded memory array may utilize high-threshold-voltage transistors in order to improved cell stability. A high-threshold voltage logic portion that exist outside the embedded memory array is not required for the method 900.

The method 900 is provided as an exemplary method in which to utilize different isolation schemes for the embedded memory and the core logic portions on the device without employing additional pattern levels or procedures as is done with method 300 of FIG. 3. The method 900 performs supplemental isolation implants into the embedded memory after the resist patterns used for channel threshold-adjust implants for high-voltage transistors are formed and before they are removed, which eliminates the need for additional pattern levels. The method 900 is also described with respect to FIGS. 10-14 so as to further illustrate the method 900. However, it is appreciated that variations in structure from FIGS. 10-14 are contemplated and permitted in accordance with the present invention.

Figure 10:
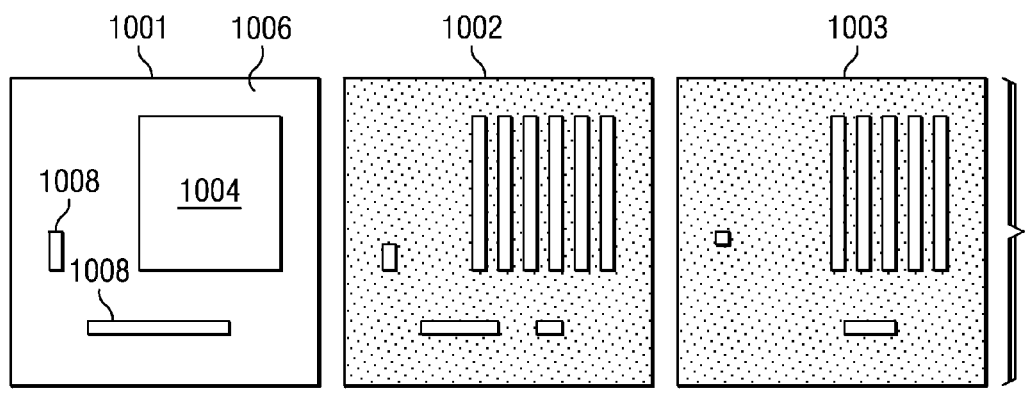
FIG. 10 is a plan view of a semiconductor device and associated resist patterns in accordance with an aspect of the present invention.

FIG. 10 is a plan view of the device of FIG. 9 and high threshold voltage resist layers in accordance with an aspect of the present invention. A top view 1001 of an exemplary device illustrates the embedded memory portion 1004, the core logic portion 1006, and the high threshold voltage logic portion 1008. A high-Vt n-well resist layer 1002 and a high-Vt p-well resist layer 1003 are also shown. These layers are employed and described further below. The method 900 begins at block 902 where p-well regions are formed for the core logic portion, high threshold voltage logic portion and embedded memory portion of the device by selectively implanting one or more p-type dopants into the substrate with selected doses, energies, and angles. FIG. 11 is a cross sectional diagram that depicts the device at this stage of fabrication in accordance with an aspect of the present invention. Shallow trench isolation (STI) regions 1114 within the core logic portion 1006, STI regions 1116 within the high threshold voltage logic portion, and STI regions 1118 within the embedded memory portion 1004 are already formed in this example. A first patterned resist layer 1120 is employed to selectively implant one or more p-type dopants 1122 into and forming p-well regions 1108, 1110, and 1112, located respectively in the core logic portion 1006, the high threshold voltage logic portion 1008, and the embedded memory portion 1004. These implants may include a relatively deep well implant, a shallower channel-stop implant, a still shallower punch-through implant, and a still shallower channel implant. Subsequent to the implants, the first resist layer 1120 is removed from the device.

Continuing at block 904, n-well areas are formed for the core logic portion, high threshold voltage logic portion and embedded memory portion by selectively implanting one or more n-type dopants (e.g., phosphorous or arsenic) at selected doses, angles, and energies. FIG. 12 serves to illustrate the device at this stage of fabrication in accordance with an aspect of the present invention. A second patterned resist layer 1230 is employed to selectively implant one or more n-type dopants 1232 into and forming n-well regions 1224, 1226, and 1228 located respectively in the core logic portion 1006, the high threshold voltage logic portion 1008, and the embedded memory portion 1004. These implants may include a relatively deep well implant, a shallower channel-stop implant, a still shallower punch-through implant, and a still shallower channel implant. The second resist layer 1230 prevents or mitigates the dopant 1232 from implanting into the p-well regions (1108, 1110, and 1112).

Exemplary concentrations with and without the supplemental implants are shown in FIGS. 27-32 and described infra.

Figure 13:
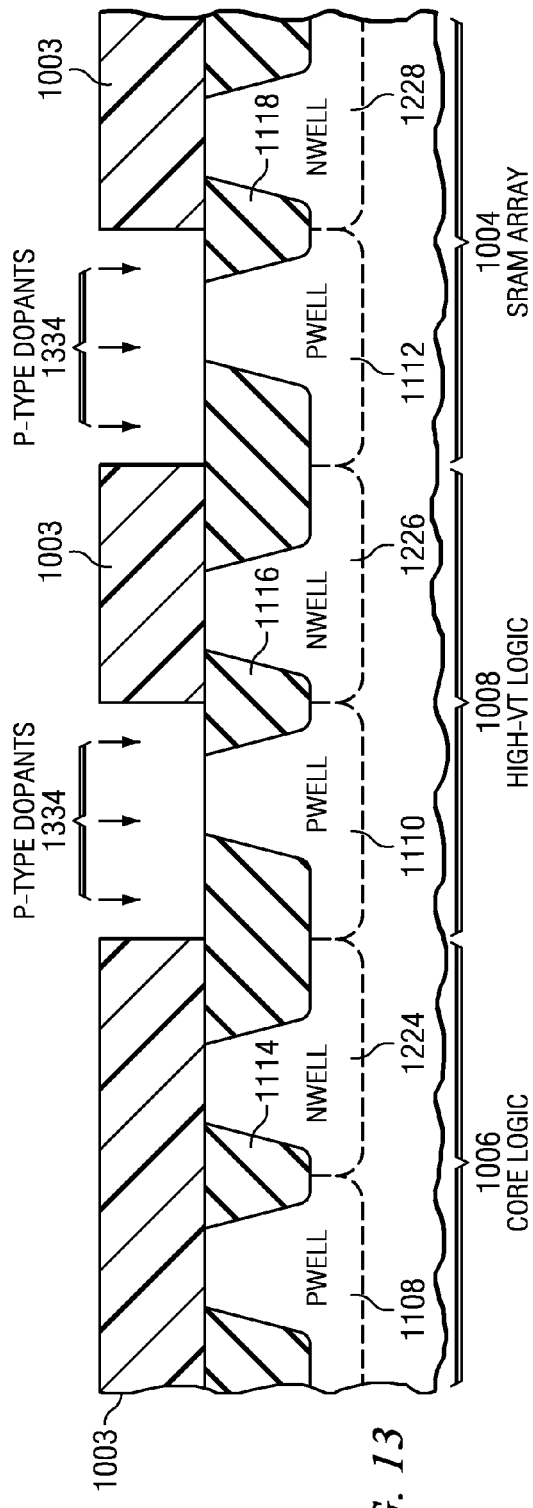
FIG. 13 is a cross sectional diagram illustrating a stage of fabrication of a semiconductor device in accordance with an aspect of the present invention.

At block 906, one or more supplemental isolation implants are performed into the high-Vt and embedded memory p-well regions. FIG. 13 illustrates the device at this stage of fabrication in accordance with an aspect of the present invention. As illustrated in FIG. 13, at this stage of the process, the high-Vt p-well resist layer 1003 is present and is used to selectively implant one or more p-type dopants in the high-Vt and memory p-well regions in order to raise the threshold voltage of transistors subsequently formed in these regions. In accordance with an aspect of the present invention, while this resist layer is still present, one or more p-type dopants 1334 are now implanted into p-wells 1110 of the high-Vt logic portion 1008 and p-wells 1112 of the embedded memory portion 1004 as supplemental isolation implants, thereby improving isolation. Exemplary concentrations with and without the supplemental implants are shown in FIGS. 27-32 and described infra. Unlike the method 300 of FIG. 3, this method 900 does not require additional pattern levels because the supplemental implant is performed during the threshold voltage raising process sequence.

Figure 14:
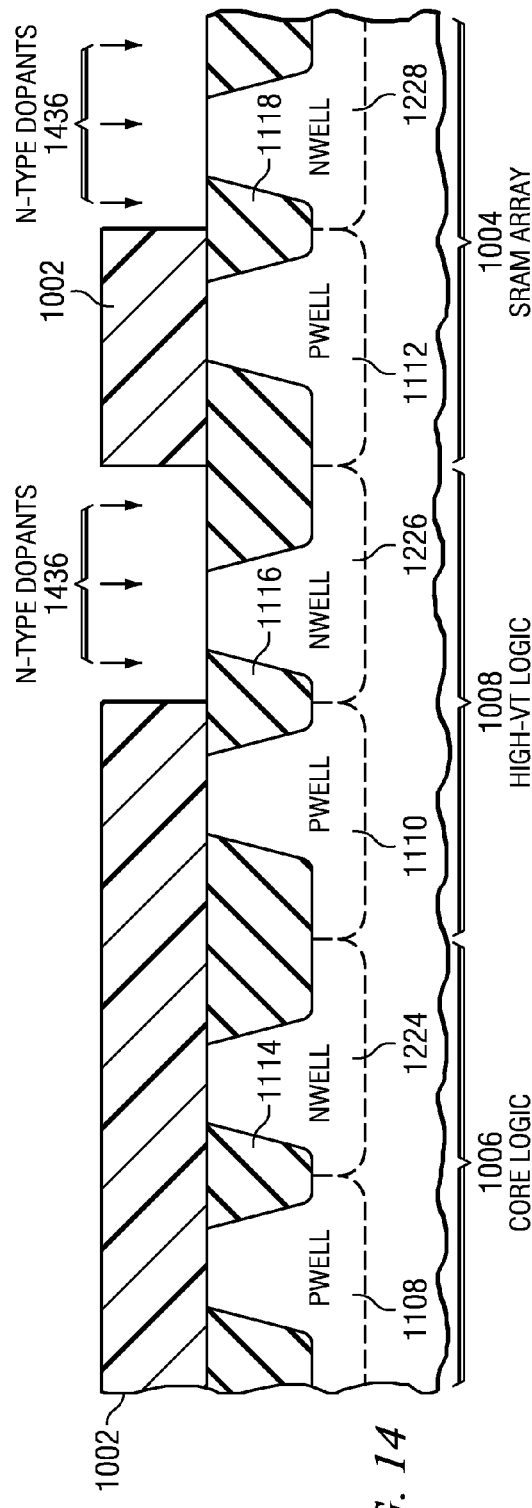
FIG. 14 is a cross sectional diagram illustrating a stage of fabrication of a semiconductor device in accordance with an aspect of the present invention.

Continuing at block 908, one or more supplemental isolation implants are performed into the high-Vt and embedded memory n-well regions. FIG. 14 serves to illustrate the device at this stage of fabrication in accordance with an aspect of the present invention. As illustrated in FIG. 14, at this stage of the process, a high VT n-well resist layer 1002 is present. This layer is typically employed to selectively implant one or more n-type dopants into the high-Vt and memory n-well regions in order to raise the threshold voltage of transistors subsequently formed in these regions. In accordance with an aspect of the present invention, while this resist layer is still present, one or more p-type dopants 1436 are now implanted into n-wells 1226 of the high-Vt logic portion 1008, and into n-wells 1228 of the embedded memory portion 1004 as supplemental isolation implants, thereby improving isolation. Again, unlike the method 300 of FIG. 3, this method 900 does not require additional pattern levels because the supplemental implant is performed during the threshold voltage raising process sequence. Furthermore, it is appreciated that the present invention includes suitable variations of this method 900 wherein only some of the transistors in the memory array are high-threshold-voltage transistors, and/or wherein only one of the supplemental p-well and supplemental n-well implants is performed. Additionally, it is appreciated that the method 900 can be performed in any suitable order and can include additional processing steps.

Standard processing is performed on the device at block 910 in order to complete fabrication of the device. The standard processing includes forming active regions, gate structures, spacers, contacts, metal interconnects and vias packaging, and the like in order to complete fabrication of the device.

Note that, for FIG. 14, a spacing of the STI regions 1118 for the memory portion 1004 is smaller than a spacing of the STI regions 1114 for the core logic portion 1006. The reduced spacing is permitted because the well regions 1112 and 1228 are more heavily doped due to the supplemental implants performed during the high threshold voltage implants. Accordingly, the packing density of the memory array 1004 can be improved. Additionally, note the reduced spacing is obtained without performing extra patterning operations, as is the case with the method 300 of FIG. 3.

Figure 15:
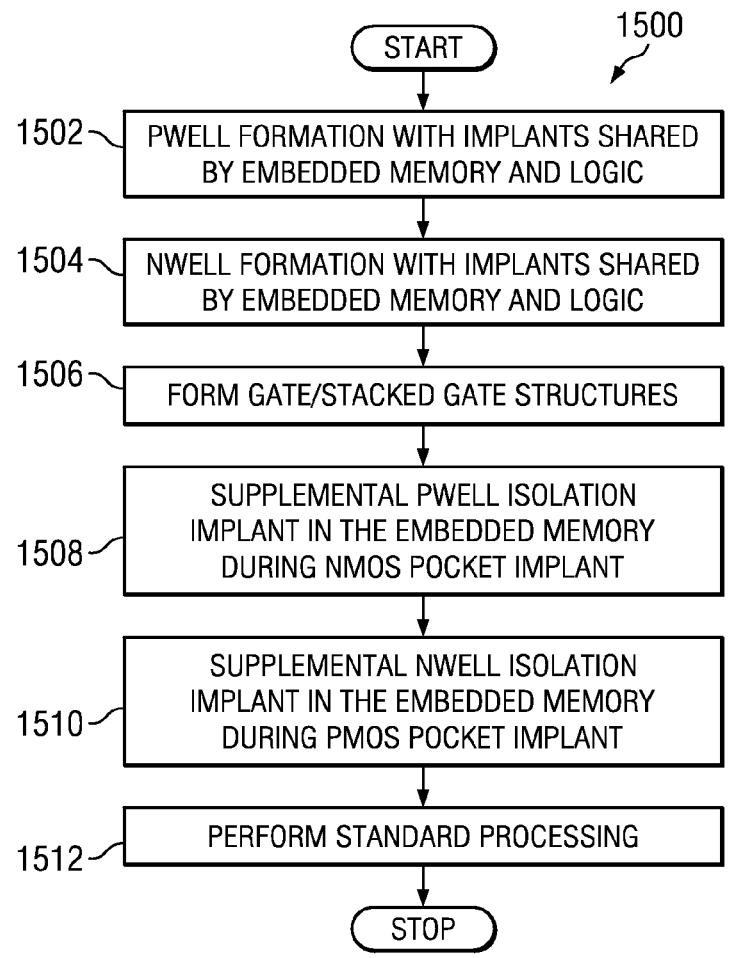
FIG. 15 is a flow diagram illustrating a method of fabricating a semiconductor device with a higher channel stop utilizing existing pattern levels employed for threshold-adjust pocket implants in accordance with an aspect of the present invention.

FIG. 15 is a flow diagram illustrating a method 1500 of fabricating a semiconductor device with a higher channel-stop or well dose for a memory array of the device by employing pattern levels already used for high threshold voltage pocket implants subsequent to gate formation. The device includes an embedded memory portion, a core logic portion, and a high-threshold-voltage logic portion. It is appreciated that, in alternate aspects of the invention, the high-threshold-voltage logic portion can be absent from the device. The embedded memory array utilizes at least some high-threshold-voltage transistors. However, the method 1500 does not require that a high-threshold voltage logic portion exist outside the memory array. The method 1500 is provided as an exemplary method in which to utilize different isolation schemes for the embedded memory and the core logic portions on the device without employing additional pattern levels or procedures. The method 1500 performs supplemental isolation implants into the embedded memory during the same process steps employed in forming the high threshold voltage transistors via pocket implants. The method 1500 is also described with respect to FIGS. 16-20 so as to further illustrate the method 1500. However, it is appreciated that variations in structure from FIGS. 16-20 are permitted in accordance with the present invention.

A pocket implant, also referred to as a halo implant, is a technique employed to reduce sensitivity of the performance of a transistor to characteristics such as gate length. Generally, the pocket implant surrounds source and drain regions and thus reduces punch-through leakage. The pocket implant is typically defined by its peak concentration depth and the amount of gate underlap controlled by an implant angle.

Figure 16:
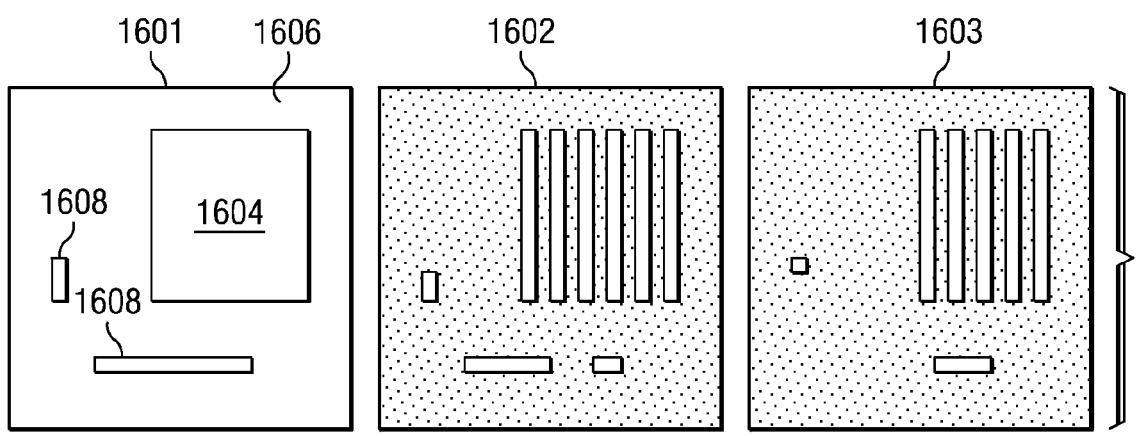
FIG. 16 is a plan view of a semiconductor device and associated resist patterns in accordance with an aspect of the present invention.

FIG. 16 is a plan view of the device of FIG. 15 and high threshold voltage pocket implant resist layers in accordance with an aspect of the present invention. A top view 1601 of the device illustrates the embedded memory portion 1604, the core logic portion 1606, and the high threshold voltage logic portion 1608. A high-Vt n-well resist layer 1602 and a high- Vt p-well resist layer 1603 employable in threshold adjustment pocket implants are also shown. These layers are employed and described further below.

Figure 17:
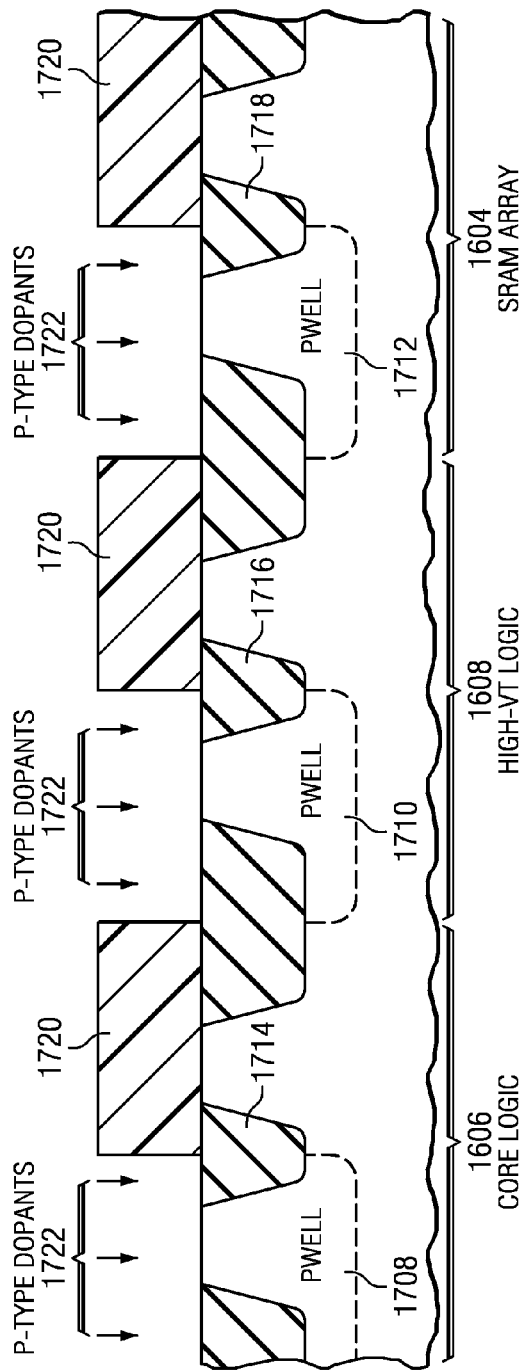
FIG. 17 is a cross sectional diagram illustrating a stage of fabrication of a semiconductor device in accordance with an aspect of the present invention.

The method 1500 begins at block 1502 where p-wells are formed for the core logic portion, high threshold voltage logic portion and embedded memory portion. FIG. 17 is a cross sectional diagram that depicts the device at this stage of fabrication in accordance with an aspect of the present invention. Shallow trench isolation (STI) regions 1714 within the core logic portion 1606, STI regions 1716 within the high threshold voltage logic portion, and STI regions 1718 within the embedded memory portion 1604 are already formed. A first patterned resist layer 1720 is employed to selectively implant one or more p-type dopants 1722 to form p-well regions 1708, 1710, and 1712, located respectively in the core logic portion 1606, the high threshold voltage logic portion 1608, and the embedded memory portion 1604. These implants may include a relatively deep well implant, a shallower channel-stop implant, a still shallower punch-through implant, and a still shallower channel implant. Subsequent to the implant, the first resist layer 1720 is removed from the device.

Figure 18:
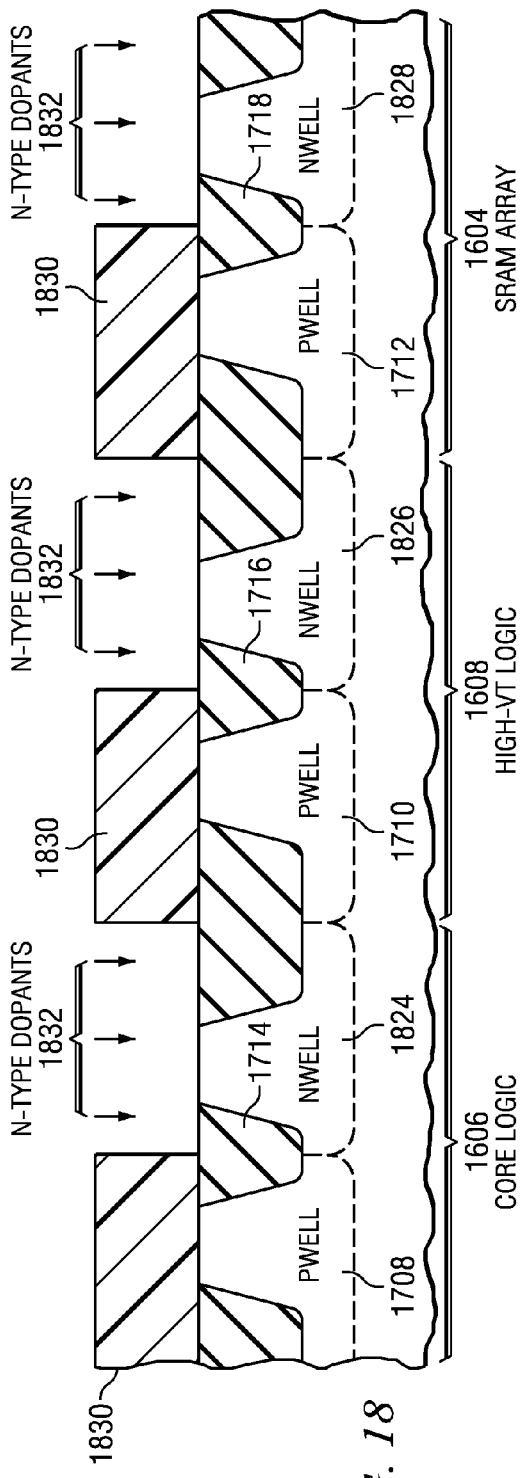
FIG. 18 is a cross sectional diagram illustrating a stage of fabrication of a semiconductor device in accordance with an aspect of the present invention.

Continuing at block 1504, n-wells are formed for the core logic portion, high threshold voltage logic portion and embedded memory portion. FIG. 18 serves to illustrate the device at this stage of fabrication in accordance with an aspect of the present invention. A second patterned resist layer 1830 is employed to selectively implant one or more n-type dopants 1832 to and form n-well regions 1824, 1826, and 1828 located respectively in the core logic portion 1606, the high threshold voltage logic portion 1608, and the embedded memory portion 1604. These implants may include a relatively deep well implant, a shallower channel-stop implant, a still shallower punch-through implant, and a still shallower channel implant. The second resist layer 1830 prevents or mitigates the dopant 1832 from implanting into the p-well regions (1708, 1710, and 1712). Subsequent to the implant, the second resist layer 1830 is removed from the device.

Gate structures are formed within the various n-well and p-well regions at block 1506. A series of semiconductor fabrication processes including depositing and patterning are employed to form the gate structure.

At block 1508, one or more supplemental isolation implants are performed into the high-Vt and embedded memory p-well regions. FIG. 19 illustrates the device at this stage of fabrication in accordance with an aspect of the present invention. As illustrated in FIG. 19, at this stage of the process, a high-Vt p-well resist layer 1603 is present. This layer is typically used to selectively implant one or more p-type dopants in the high-Vt and memory p-well regions as pocket implants in order to raise the threshold voltage of transistors in these regions. In accordance with an aspect of the present invention, while this resist layer is still present, one or more p-type dopants 1936 are now implanted into p-wells 1710 of the high-Vt logic portion 1608 and p-wells 1712 of the embedded memory portion 1604 as supplemental isolation implants, thereby improving isolation.

Continuing at block 1510, one or more supplemental isolation implants are performed into the high-Vt and embedded memory n-well regions. FIG. 20 serves to illustrate the device at this stage of fabrication in accordance with an aspect of the present invention. As illustrated in FIG. 20, at this stage of the process, a high VT n-well resist layer 1602 is present. This layer is typically employed to selectively implant one or more n-type dopants into the high-Vt and memory n-well regions as pocket implants in order to raise the threshold voltage of transistors in these regions. In accordance with an aspect of the present invention, while this resist layer is still present, one or more p-type dopants 2040 are now implanted into n-wells 1826 of the high-Vt logic portion 1608, and into n-wells 1828 of the embedded memory portion 1604 as supplemental isolation implants, thereby improving isolation. Again, unlike the method 300 of FIG. 3, this method 1500 does not require additional pattern levels because the supplemental implant is performed during the threshold voltage raising process sequence. Furthermore, it is appreciated that the present invention includes variations of this method 1500 wherein only one of the supplemental p-well and supplemental n-well implants is performed, and wherein the blocks 1502 and 1504 are performed in any suitable order, and the two blocks 1508 and 1510 are performed in any suitable order. Standard processing is performed on the device at block 1512 in order to complete fabrication of the device. The standard processing includes forming active regions, gate structures, spacers, contacts, metal interconnects and vias, packaging, and the like in order to complete fabrication of the device.

Figure 21:
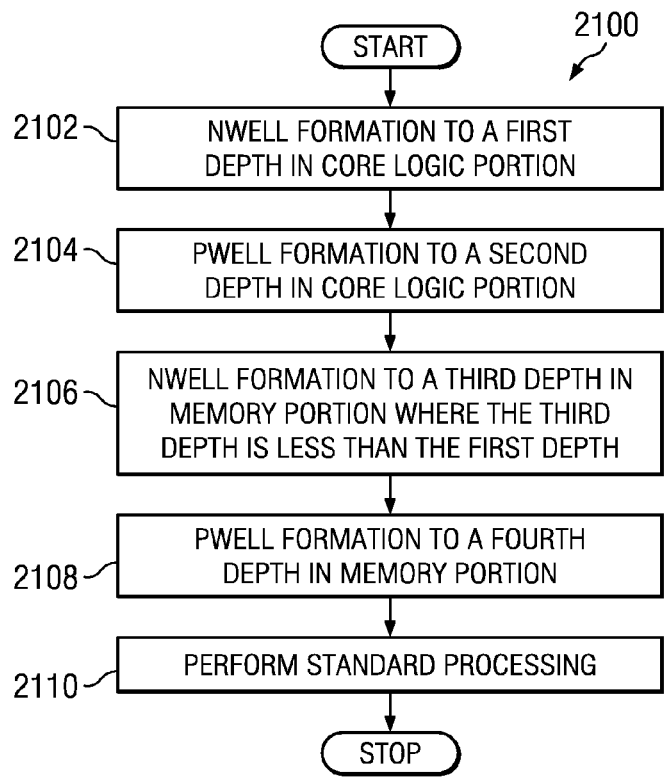
FIG. 21 is a flow diagram illustrating a method of fabricating a semiconductor device, wherein isolation implants are shallower within the memory portion within the device in accordance with an aspect of the present invention.

Turning now to FIG. 21, a flow diagram illustrating a method 2100 of fabricating a semiconductor device wherein well/isolation implants are shallower within a memory portion of the device than within a core logic portion of the device. The shallower implants can yield improved isolation and tighter n+-p+ spacing for the memory portion of the device by making the isolation performance more immune to misalignment.

As described previously, n-well and p-well regions are typically separated in semiconductor devices by shallow trench isolation (STI) regions. The bottoms of these STI regions are generally narrow. As a result, if a deep isolation/well implant is misaligned by even a relatively small amount, the implant will cross over into semiconductor material on an opposite side of the STI region, thereby degrading isolation. However, if the isolation/well implant is relatively shallow, relatively larger misalignments can occur without substantial isolation degradation due to the wider extent of the STI region at the shallower depth. A drawback of the shallow well/isolation implant is that it increases junction capacitance. However, this increase in junction capacitance can be acceptable for the memory regions of devices.

The method 2100 begins at block 2102 wherein one or more implants are performed to form a plurality of n-wells to a first depth in the core logic portion of the device. These implants may include a relatively deep well implant, a shallower channel-stop implant, a still shallower punch-through implant, and a still shallower channel implant. The first depth is determined primarily by the deeper implants, including the well and/or channel-stop implants. A set of doses and energies are selected and utilized to achieve the desired depth and desired concentration profile. Then, one or more implants are performed to form a plurality of p-wells to a second depth in the core logic portion of the device. The second depth can be comparable to the first depth, but is not necessarily so. For the memory portion of the device, one or more implants are performed at block 2106 to form a plurality of n-wells to a third depth in the memory portion . Continuing, a p-well implant is performed at block 2108 to a fourth depth in the memory portion. The order and number of resist layers and masks employed to perform the above blocks can vary and still be in accordance with the present invention.

At block 2110, standard processing is performed on the semiconductor device in order to complete fabrication of the device. The standard processing includes forming active regions, gate structures, spacers, contacts, metal interconnects and vias, packaging, and the like in order to complete fabrication of the device.

Figure 22:
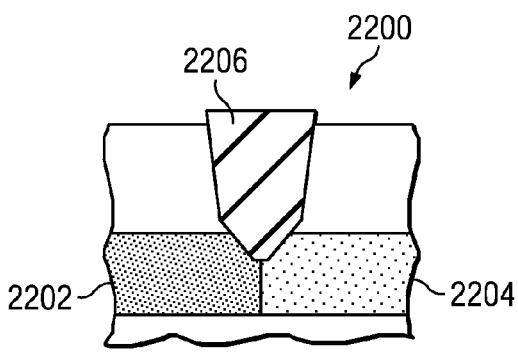
FIG. 22 is a cross sectional diagram illustrating deep implants in a core logic portion of a semiconductor device in accordance with an aspect of the present invention.
Figure 23:
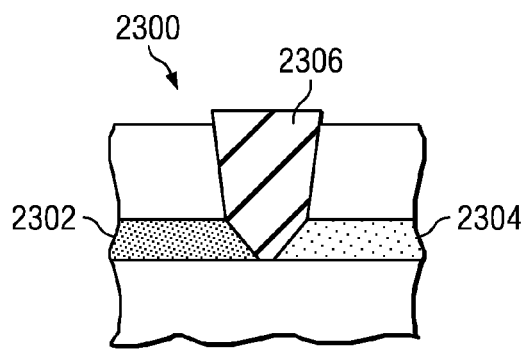
FIG. 23 is a cross sectional diagram illustrating relatively shallow implants in a memory portion of a semiconductor device in accordance with an aspect of the present invention.

FIGS. 22-26 presented below serve to further illustrate the method 2100 of FIG. 21 by depicting examples of devices fabricated by the method 2100 and variations thereof. FIG. 22 is a cross sectional diagram illustrating deep implants in a core logic portion of a semiconductor device 2200 in accordance with an aspect of the present invention. The device 2200 is depicted with an n-well region 2202, a p-well region 2204 and an STI region 2206. The n-well region 2202 and the p-well region 2204 have a greater depth than that of the STI region 2206. As a result, misalignment in performing the n-well and/or p-well implants can result in degrading isolation of the respective regions. FIG. 23 is another cross sectional diagram illustrating shallow implants in the memory portion of a semiconductor device 2300 in accordance with an aspect of the present invention. The device 2300 includes a p-well region 2302, an n-well region 2304, and a STI region 2306. In this example, the p-well region 2302 and the n-well region 2304 are relatively shallower than the regions in FIG. 22. As a result, relatively larger implant misalignments (e.g., due to poor resist alignment) can occur without impacting isolation of the respective regions.

Figure 24:
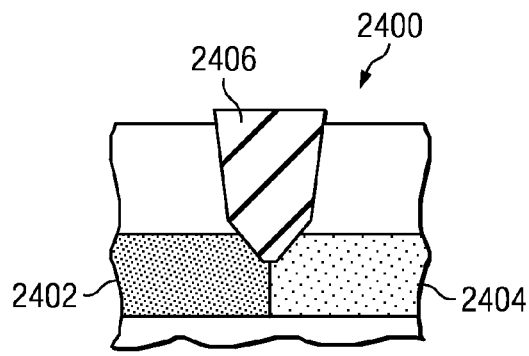
FIG. 24 is a cross sectional diagram illustrating deep implants in a core logic portion of a semiconductor device in accordance with an aspect of the present invention.
Figure 25:
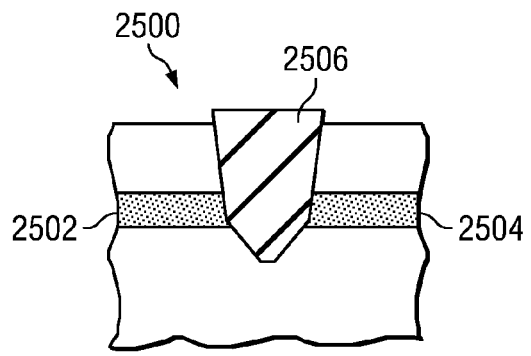
FIG. 25 is a cross sectional diagram illustrating relatively very shallow implants in a memory portion of a semiconductor device in accordance with an aspect of the present invention.

FIG. 24 is a cross sectional diagram illustrating deep implants in a core logic portion of a semiconductor device 2400 in accordance with an aspect of the present invention. The device 2400 is depicted with an n-well region 2402, a p-well region 2404 and an STI region 2406. The n-well region 2402 and the p-well region 2204 have a greater depth than that of the STI region 2406. FIG. 25 is another cross sectional diagram illustrating very shallow implants in the memory portion of a semiconductor device 2500 in accordance with an aspect of the present invention. The device 2500 also includes a p-well region 2502, an n-well region 2504, and a STI region 2506. In contrast to the regions of FIG. 24, the p-well region 2502 and the n-well region 2504 do not have a greater depth that the STI region 2506, in this example. In fact, the p-well region 2502 and the n-well region 2504 have a depth such that they are adjacent to a relatively thick portion of the STI region 2506. As a result, relatively much larger implant misalignments can occur without impacting isolation of the respective regions.

Figure 26:
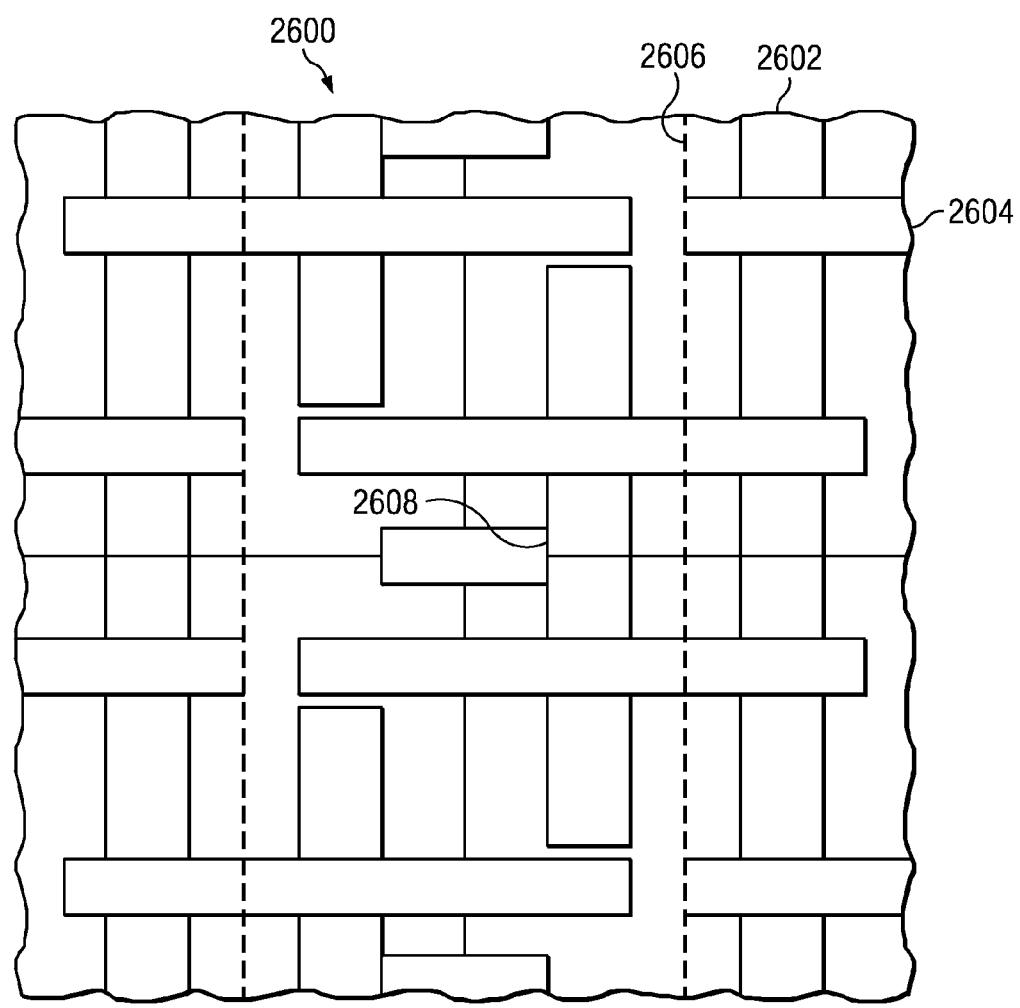
FIG. 26 is a plan view schematic diagram of memory cells with butted contacts to the relatively very shallow N-well.

One potential problem with shallow implant/well regions described above is that different active regions that would have been located within a single shared deep well may no longer share a common well, each having its own local well instead. For such cases, it may be necessary to connect each local well to the desired potential using a butted contact. FIG. 26 is a diagram illustrating an example of a suitable topology 2600 for a memory portion of a device in accordance with an aspect of the present invention. The topology 2600 includes active regions 2602, polysilicon layers 2604, n-well pattern 2606 and butted contacts 2608. Respective active regions 2602 are shown containing butted contacts 2608, which connect to the underlying local n-wells.

It is appreciated that other suitable arrangements and topologies can be employed in be in accordance with the present invention.

While, for purposes of simplicity of explanation, the methodologies described supra are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIGS. 27-32, discussed infra, are provided to illustrate exemplary suitable dopant profiles that can be employed with the methodologies described supra. It is noted that other suitable dopant profiles can be employed in accordance with the present invention. Such dopant profiles can be employed for a device that comprises at least a logic portion and an embedded memory portion, as described previously.

Figure 27:
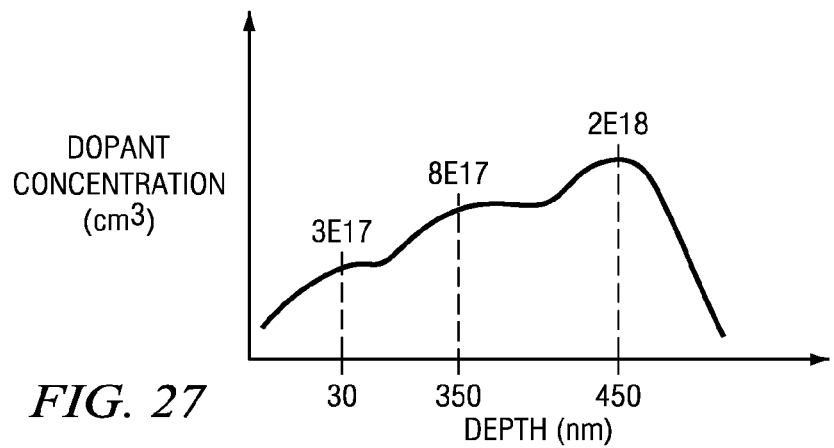
FIG. 27 is a graph illustrating a dopant profile for an n-well within a logic region in accordance with an aspect of the present invention.
Figure 28:
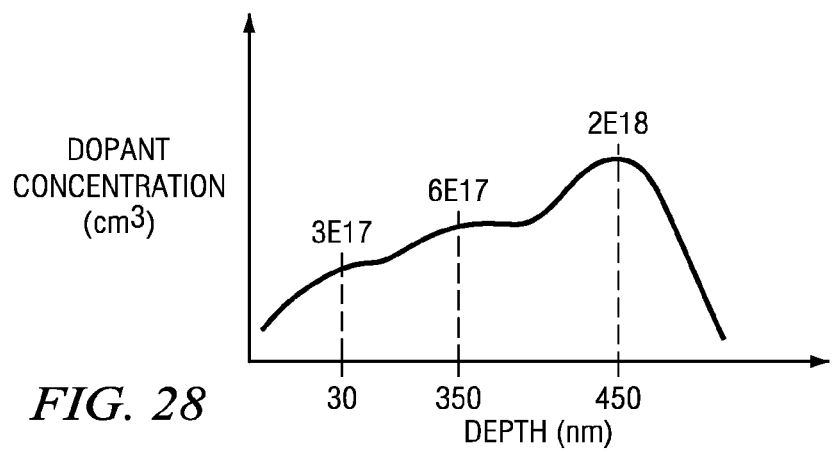
FIG. 28 is a graph illustrating a dopant profile for an p-well within a logic region in accordance with an aspect of the present invention.

Beginning with FIG. 27, a graph illustrating a dopant profile for an n-well in a logic region in accordance with an aspect of the present invention is shown. An x-axis depicts depth form a well surface and a y-axis depicts dopant concentration. It can be seen that the dopant concentration varies throughout the depth. FIG. 28 is a graph illustrating a dopant profile for a p-well within a logic region in accordance with an aspect of the present invention. Again, an x-axis depicts depth form a well surface and a y-axis depicts dopant concentration. It can be seen that the dopant concentration also varies throughout the depth.

Figure 29:
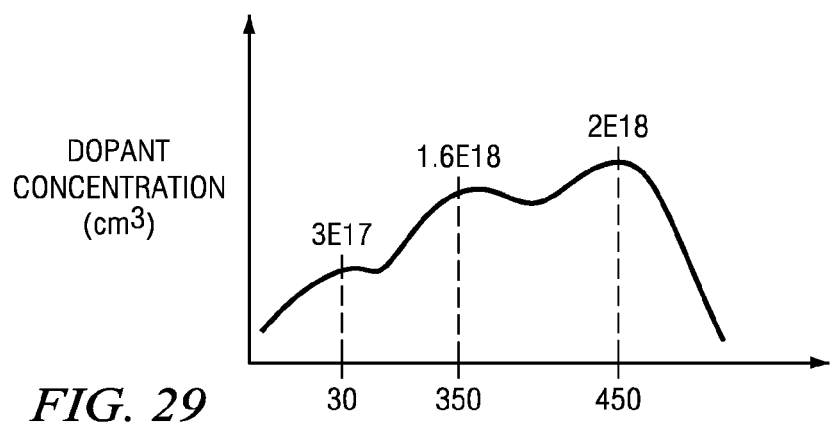
FIG. 29 is a graph illustrating a dopant profile for an n-well within an embedded memory array in accordance with an aspect of the present invention.
Figure 30:
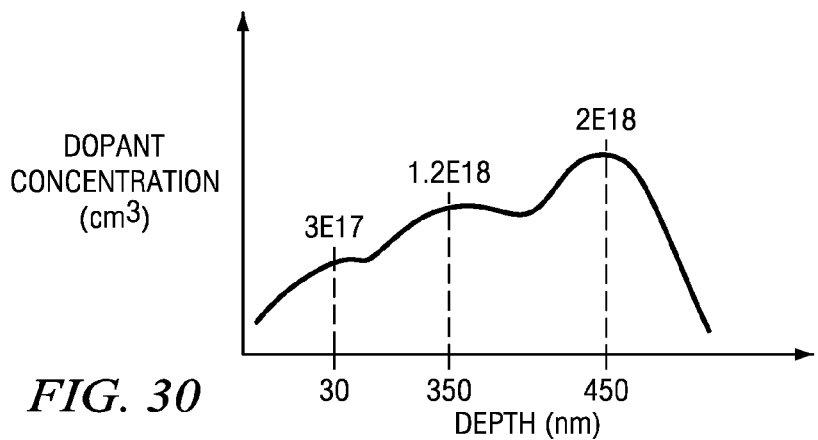
FIG. 30 is a graph illustrating a dopant profile for a p-well within an embedded memory array in accordance with an aspect of the present invention.

FIG. 29 is a graph illustrating a dopant profile for an n-well within an embedded memory array in accordance with an aspect of the present invention. An x-axis depicts depth form a well surface and a y-axis depicts dopant concentration. Compared with the n-well within the logic region, the n-well within the embedded memory has a relatively higher concentration. Turning to FIG. 30, a graph illustrating a dopant profile for a p-well within an embedded memory array in accordance with an aspect of the present invention is shown. An x-axis depicts depth form a well surface and a y-axis depicts dopant concentration. Compared with the p-well within the logic region, the p-well within the embedded memory has a relatively higher concentration. The higher dopant concentrations shown in the embedded memory array result in a higher junction capacitance for those regions. However, the relatively higher dopant concentrations permit tighter isolation spacing within the embedded memory array.

Figure 31:
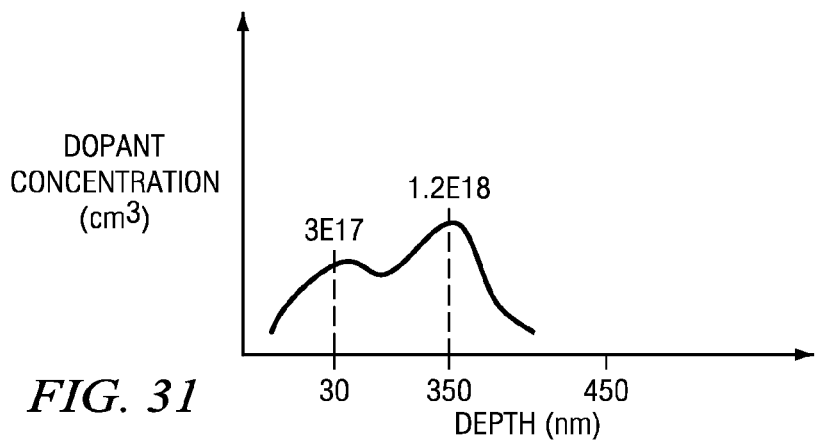
FIG. 31 is a graph illustrating a shallow dopant profile for an n-well within an embedded memory array in accordance with an aspect of the present invention.
Figure 32:
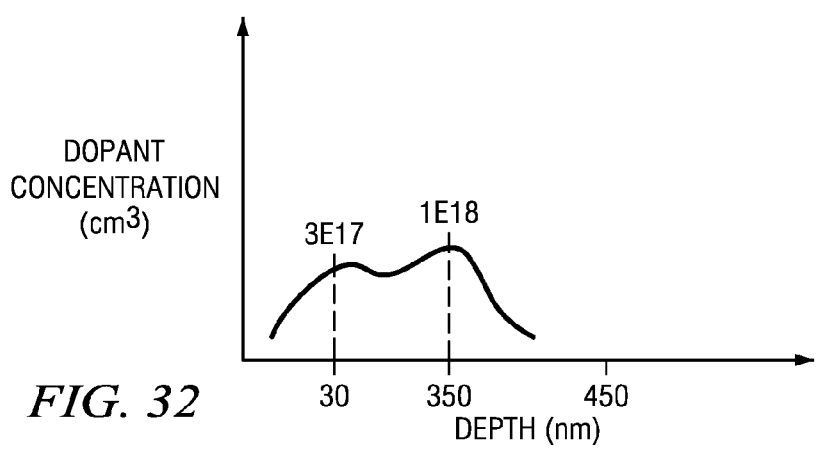
FIG. 32 is a graph illustrating a shallow dopant profile for a p-well within an embedded memory array in accordance with an aspect of the present invention.

FIG. 31 is a graph illustrating a shallow dopant profile for an n-well within an embedded memory array in accordance with an aspect of the present invention. An x-axis depicts depth form a well surface and a y-axis depicts dopant concentration. Compared with the n-well within the logic region, the n-well within the embedded memory has a relatively higher concentration and is substantially shallower. Turning to FIG. 32, a graph illustrating a shallow dopant profile for a p-well within an embedded memory array in accordance with an aspect of the present invention is shown. An x-axis depicts depth form a well surface and a y-axis depicts dopant concentration. Compared with the p-well within the logic region, the p-well within the embedded memory has a relatively higher concentration and is also substantially shallower. The higher dopant concentrations shown in the embedded memory array result in a higher junction capacitance for those regions. However, the relatively higher dopant concentrations permit tighter spacing within the embedded memory array.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of fabricating a semiconductor device comprising:
    forming first type well regions within a core logic portion having a first dopant concentration depth profile;
    forming second type well regions within the core logic portion having a second dopant concentration depth profile, wherein the second type is opposite of the first type;
    forming first type well regions within an embedded memory portion having a third dopant concentration depth profile that is distinct from the first dopant concentration depth profile; and
    forming second type well regions within the embedded memory portion having a fourth dopant concentration depth profile that is distinct from the second dopant concentration depth profile.

2. The method of claim 1, wherein the embedded memory portion that the first type well regions and the second type well regions are formed in is static random-access memory.

3. The method of claim 1, wherein the third dopant concentration depth profile provides relatively increased isolation compared with the first dopant concentration depth profile.

4. The method of claim 1, wherein forming the first type well regions within the embedded memory portion comprises performing a supplemental isolation implant within the first type well regions within the embedded memory portion to obtain the third dopant concentration depth profile.

5. The method of claim 4, wherein performing the isolation implant occurs during a threshold voltage adjustment implant.

* * * * *